US006414333B1

(12) United States Patent
Lee et al.

(10) Patent No.: US 6,414,333 B1
(45) Date of Patent: Jul. 2, 2002

(54) SINGLE ELECTRON TRANSISTOR USING POROUS SILICON

(75) Inventors: Jo-won Lee, Suwon; Chung-woo Kim, Seongnam; Byong-man Kim, Kunpo; Moon-kyung Kim, Seoul, all of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/522,603

(22) Filed: Mar. 10, 2000

(51) Int. Cl.$^7$ .............................................. H01L 29/06
(52) U.S. Cl. .............................. 257/9; 257/24; 438/590
(58) Field of Search ............................... 257/20, 17, 24, 257/30, 347, 9

(56) References Cited

U.S. PATENT DOCUMENTS

| | | | | |
|---|---|---|---|---|
| 5,359,214 A | * | 10/1994 | Kurtz et al. | 257/287 |
| 5,710,436 A | * | 1/1998 | Tanamoto et al. | 257/17 |
| 5,714,766 A | * | 2/1998 | Chen et al. | 257/20 |
| 5,731,598 A | * | 3/1998 | Kado et al. | 257/30 |
| 5,754,077 A | * | 5/1998 | Ohata et al. | 257/24 |
| 6,278,231 B1 | * | 8/2001 | Iwasaki et al. | 313/310 |
| 6,285,072 B1 | * | 9/2001 | Maeda | 257/347 |

OTHER PUBLICATIONS

Chen, W. et al., "Coulomb blockade at 77K in nanoscale metallic islands in a lateral nanostsructure." Appl. Phys. Lett 66 (24), Jun. 12, 1995, pp. 3383–3384.

Matsumoto, K. et al., "Room temperature operation of a single electron transistor made by the scanning tunneling microscope nanooxidation process for the $TiO_x/Ti$ system." Appl. Phys. Lett. 68 (1), Jan. 1, 1996, pp. 34–36.

Wada, Toshimi, et al., "$SiO_2$/Poly–Si Multilayered Electron Beam Resist Process for Fabrication of Ulrasmall Tunnel Junctions." Jpn. J. Appl. Phys., vol. 34 (1995), pp. 6961–6965.

Dutta, Amit, et al., "Fabrication and Electrical Characteristics of Single Electron Tunneling Devices Based on Si Quantum Dots Prepared by Plasma Processing." Jpn. J. Appl. Phys., vol. 36 (1997), pp. 4038–4041.

* cited by examiner

Primary Examiner—David Nelms
Assistant Examiner—Andy Huynh
(74) Attorney, Agent, or Firm—Burns, Doane, Swecker & Mathis, L.L.P.

(57) ABSTRACT

A single electron transistor using porous silicon, which is fabricated by applying porous silicon having a size of several tens of nanometers obtained by electrochemically etching silicon, and a fabrication method thereof, are provided. In the single electron transistor using porous silicon, silicon pores, each of which has a diameter of 5 nm or less, are fabricated by electrochemically etching a silicon on insulator (SOI) substrate having silicon dioxide ($SiO_2$) in its lower portion using an HF-based solution, and serve as islands of a single electron transistor. Also, a source and a drain are formed of silicon on which metal is deposited or silicon doped with impurities. Hence, formation of islands and tunnel barriers is easy, mass production is possible, and the sizes of islands can be controlled by oxidation, so that single electron transistors capable of operating at room temperature can be easily fabricated.

7 Claims, 10 Drawing Sheets

SINGLE ELECTRON TRANSISTOR USING POROUS SILICON

BACKGROUND OF THE INVENTION

1. Field of the Invention

The present invention relates to a single electron transistor fabricated by applying porous silicon having a size of several tens of nanometers obtained by electrochemically etching silicon, and a fabrication method thereof.

2. Description of the Related Art

FIGS. 1A and 1B are schematic vertical cross-sectional views of conventional single electron transistors. As shown in FIG. 1A, a conventional single electron transistor has a structure in which an island 4 is defined by forming two tunnel barriers 5 between a source 2 and a drain 3 on a silicon substrate 1. As shown in FIG. 1B, another conventional single electron transistor has a structure in which a source 12 and a drain 13 are formed on an SOI substrate 11 obtained by forming an $SiO_2$ insulative layer 11b on a silicon substrate 11a, and nanometer (nm)-sized granular islands 14 are formed by physical vapor deposition (PVD) or chemical vapor deposition (CVD) of a metal or semiconductor within a dielectric 15.

However, according to a reference document Jpn.J.Appl. Phys 34,12B(1995)6961 by T. Wada et al, in the case of single electron transistors of the type shown in FIG. 1A, it is very difficult to uniformly adjust the sizes of the islands 15 to nm-sizes. In particular, according to a reference document Appl.Phys.Lett 68 (1996)34 by K.Matsumoto et al., when scanning probe microscopy (SPM) is applied, tunnel barriers deteriorate when exposed to the air, so that the single electron transistor of FIG. 1A has no operation reproducibility. According to reference documents Appl. Phys.Lett 66 (1995)3383 by W.Chen et al. and Jpn.J.Appl. Phys 36,6 B(1997)4038 by A.Dutta et al., in the case of single electron transistors of the type shown in FIG. 1B, it is difficult to reproducibly control the distance between the source 12 and the drain 13 which determines the number of islands 14, and a complicated fabrication process makes it difficult to fabricate the transistors. Therefore, a new structure and a new and simple fabrication method capable of easily adjusting the sizes of islands to nanometer sizes are required in order to realize reproducible single electron transistors which operate at room temperature.

SUMMARY OF THE INVENTION

To solve the above problem, an objective of the present invention is to provide a single electron transistor using porous silicon, which can operate at room temperature and can be applied to next-generation ultra high-density (1-T Byte) memories and logic devices, and a fabrication method thereof.

To achieve the above objective, there is provided a single electron transistor using porous silicon, including: a substrate; a porous silicon layer having pores, each of which has a diameter of 5 nm or less, the porous silicon layer formed as a channel on the substrate; a source and a drain formed of metal on both sides of the porous silicon layer; an insulative layer formed of oxide on the porous silicon layer; and a gate formed on the insulative layer.

It is preferable that the porous silicon layer has a thickness of 10 nm or less.

To achieve the above objective, there is a method of fabricating a single electron transistor using porous silicon, including: (a) forming a porous silicon layer having pores, each of which has a diameter of 5 nm or less by electrochemically etching a 10 nm or thinner silicon layer in a silicon on insulator (SOI) substrate by dipping the SOI substrate into an HF-based solution (b) securing a source region and a drain region by etching regions of the porous silicon layer at regular intervals, and depositing metal in the source and drain regions, to form a source and a drain each having a thickness of 100 nm or less; and (c) depositing a 10-nm or thinner silicon dioxide layer on the porous silicon layer between the source and drain by chemical vapor deposition, and forming a 100-nm or thinner gate on the silicon dioxide.

In the step (b), preferably, the metal is deposited by physical vapor deposition or chemical vapor deposition. It is also preferable that in steps (b) and (c), the source, drain and gate are formed by a selective etching method or a lift-off process.

To achieve the above objective, there is provided another method of fabricating a single electron transistor using porous silicon, including: (a) exposing portions on which a source and a drain are to be formed, by selectively etching a 10-nm-thick silicon layer included in a silicon on insulator (SOI) substrate, and depositing metal on the exposed portions to have a thickness of 100 nm or less, thereby forming a source and a drain; (b) exposing only the silicon layer by forming resist on the source and drain, and then electrochemically etching the exposed silicon layer by dipping the SOI substrate into an HF-based solution, thereby forming a porous silicon layer having pores, each of which has a diameter of 5 nm or less; and (c) depositing a 10-nm or thinner silicon dioxide layer on the porous silicon layer by chemical vapor deposition, and forming a 100-nm or thinner gate on the silicon dioxide.

Preferably, in the step (a), the metal is deposited by physical vapor deposition or chemical vapor deposition. It is preferable that in steps (b) and (c), the source, drain and gate are formed by a selective etching method or a lift-off process.

To achieve the above objective, there is provided another single electron transistor using porous silicon, including: a substrate; a porous silicon layer having pores, each of which has a diameter of 5 nm or less, the porous silicon layer formed as a channel on the substrate; a source and a drain formed of silicon doped with impurities on both sides of the porous silicon layer; an insulative layer formed of oxide on the porous silicon layer; and a gate formed on the insulative layer.

Preferably the porous silicon layer has a thickness of 10 nm or less and the source and drain are doped with $n^+$-type or $p^+$-type impurities at a concentration of $10^{20}/cm^3$ or less.

To achieve the above objective, there is provided a method of fabricating another single electron transistor using porous silicon, comprising: (a) forming resist patterns at regular intervals on a silicon on insulator (SOI) substrate having a 10-nm or thinner silicon layer, and then electrochemically etching an exposed portion of the silicon layer by dipping the SOI substrate into an HF-based solution, thereby forming a porous silicon layer having pores, each of which has a diameter of 5 nm or less; (b) removing the resist patterns, forming resist patterns on only the porous silicon layer to expose the remaining regions on the silicon layer, and depositing impurities on the exposed silicon layer, thereby forming a source and a drain; and (c) depositing a 10-nm or thinner insulative layer on the porous silicon layer by chemical vapor deposition, and forming a 100-nm or thinner gate on the insulative layer.

It is preferable that in the step (b), the impurities are deposited on the silicon layer at a concentration of $10^{20}/cm^3$ or less by ion-implantation or doping. It is also preferable that in the step (c), the size of each of the silicon pores in the porous silicon layer is adjusted upon formation of $SiO_2$ and the insulative layer is formed by depositing silicon dioxide to have a thickness of 10 nm or less.

To achieve the above objective, there is provided another method of fabricating another single electron transistor using porous silicon, including: (a) forming a source and a drain by selectively depositing impurities on a 10-nm-thick silicon layer included in a silicon on insulator (SOI) substrate; (b) selectively forming resist on the source and the drain to expose only the silicon layer between the source and the drain, and then electrochemically etching the exposed silicon layer by dipping the SOI substrate into an HF-based solution, thereby forming a porous silicon layer having pores, each of which has a diameter of 5 or less; and (c) depositing a 10-nm or thinner insulative layer on the porous silicon layer by chemical vapor deposition, and forming a 100-nm or thinner gate on the insulative layer.

It is preferable that in the step (a), the impurities are deposited on the silicon layer at a concentration of $10^{20}/cm^3$ or less by ion-implantation or doping. It is also preferable that the size of each of the silicon pores in the porous silicon layer is adjusted upon formation of $SiO_2$, and the insulative layer is formed by depositing silicon dioxide to have a thickness of 10 nm or less.

BRIEF DESCRIPTION OF THE DRAWINGS

The above object and advantage of the present invention will become more apparent by describing in detail preferred embodiments thereof with reference to the attached drawings in which.

DESCRIPTION OF THE PREFERRED EMBODIMENTS

Figure 1A:
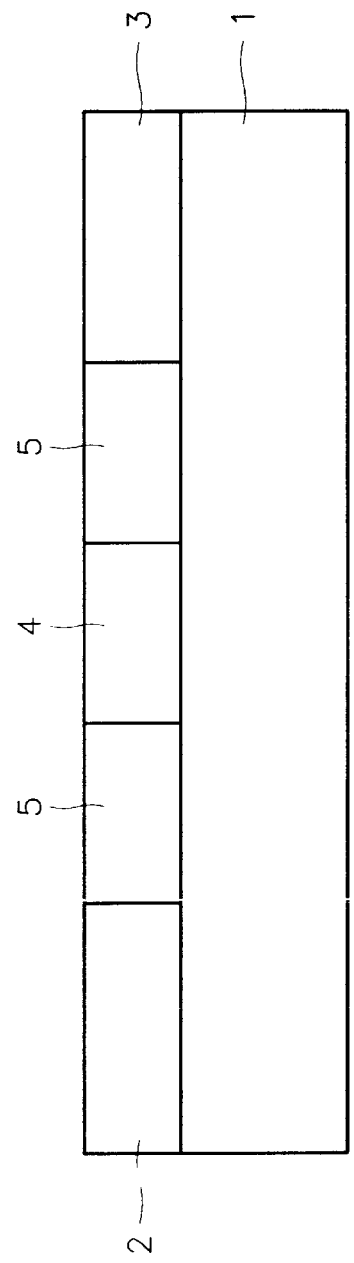
FIGS. 1A and 1B are schematic vertical cross-sectional views of conventional single electron transistors.
Figure 1B:
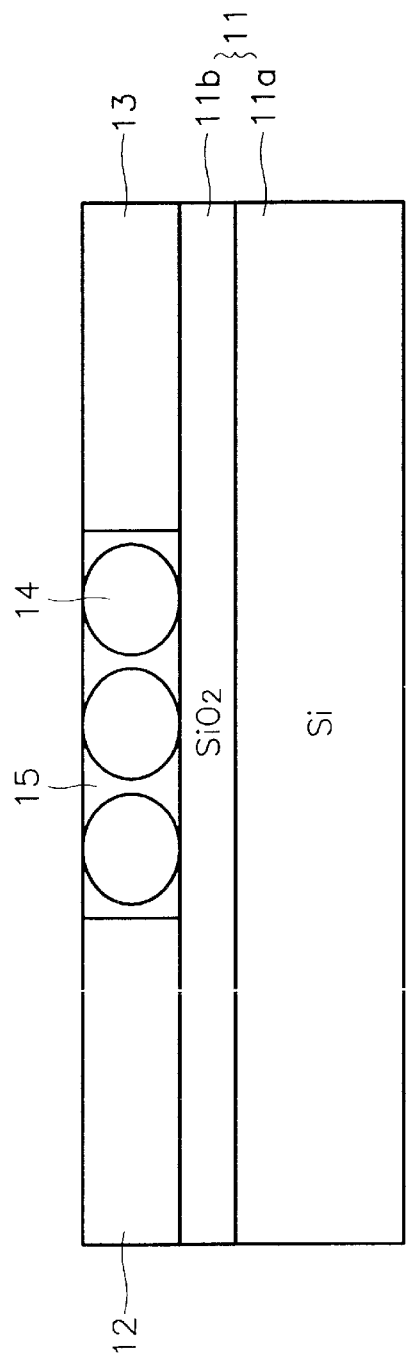
Figure 2:
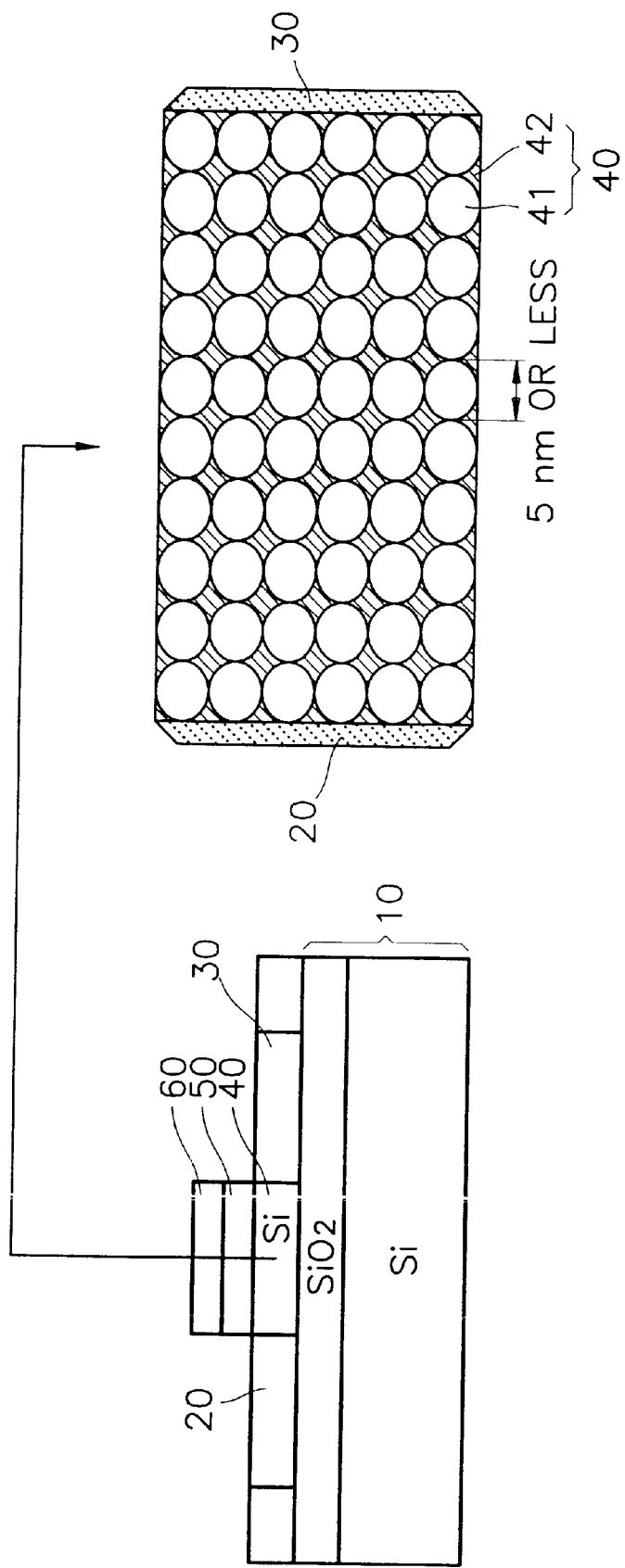
FIG. 2 is a vertical cross-sectional view of a single electron transistor using porous silicon according to the present invention.

Referring to FIG. 2, which is a vertical cross-sectional view of a single electron transistor using porous silicon according to the present invention, a porous silicon layer 40 having pores 41 with a diameter of 5 nm or less is formed as a channel on an SOI substrate 10. A source 20 and a drain 30 formed by depositing a metal are provided on both sides of the porous silicon layer 40. An oxide insulative layer 50 and a gate 60 are sequentially formed on the porous silicon layer 40. Here, silicon 42 between the pores 41 of the porous silicon layer 40, which is a channel, serves as an island, and the porous silicon layer 40 has a thickness of 10 nm or less.

A single electron transistor having such a structure can be fabricated by two methods. The first one is to form a source and a drain of a metal after a channel porous silicon layer is formed.

Figure 3A:
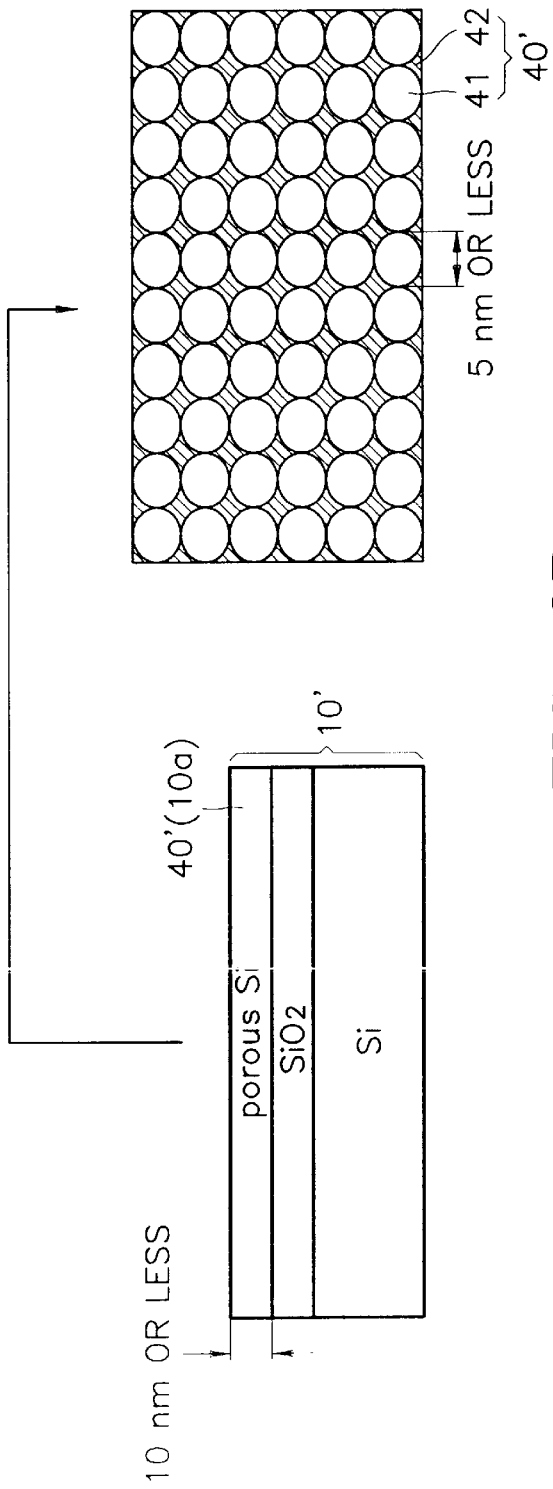
FIGS. 3A and 3B are vertical cross-sectional views of the single electron transistor using porous silicon of FIG. 2 after steps according to an embodiment of the present invention are performed.

As shown in FIG. 3A, first, a porous silicon layer 40' is formed by electrochemically etching the SOI substrate 10' having a silicon layer 10a with a thickness of 10 nm or less, within an HF-based solution. Here, the diameter of each pore in the porous silicon layer 40' is 5 or less. The electrochemical etching also includes a simple method of dipping without applying a voltage within a HF-based solution, as well as a method of dipping with a voltage applied within an HF-based solution.

Figure 3B:
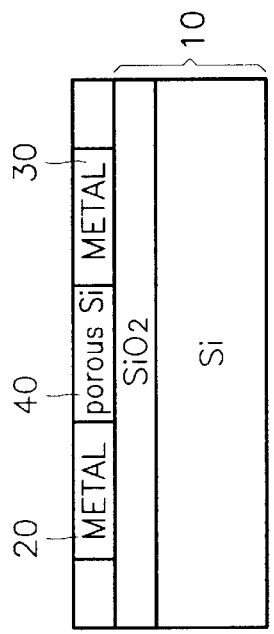

Next, as shown in FIG. 3B, regions for a source and a drain are obtained through etching, and a metal is deposited on the regions, thereby forming the source 20 and the drain 30 each having a thickness of 100 nm or less. Here, the metal is deposited by physical vapor deposition (PVD) or chemical vapor deposition (CVD). Undoubtedly, the metal can be deposited by plating. In this case, there are constrictions between adjacent islands. The constriction serves as a tunnel barrier on account of its quantum-mechanical size, and the size (i.e., thickness and diameter) of the porous silicon layer 40 is freely controllable due to the formation of silicon dioxide ($SiO_2$) in an oxidizing furnace.

Then, the $SiO_2$ layer 50 having a thickness of 10 nm or less is formed on the porous silicon layer 40 by PVD or CVD, and the gate 60 having a thickness of 100 nm or less is formed on the $SiO_2$ layer 50 by an etching process or a lifting-off process, thereby completing the formation of the transistor. Here, the deposition is the same as the deposition for forming the source and the drain.

In the second method of forming a single electron transistor having the structure shown in FIG. 2, a channel porous silicon layer is formed after a source and a drain are formed of metal.

Figure 4A:
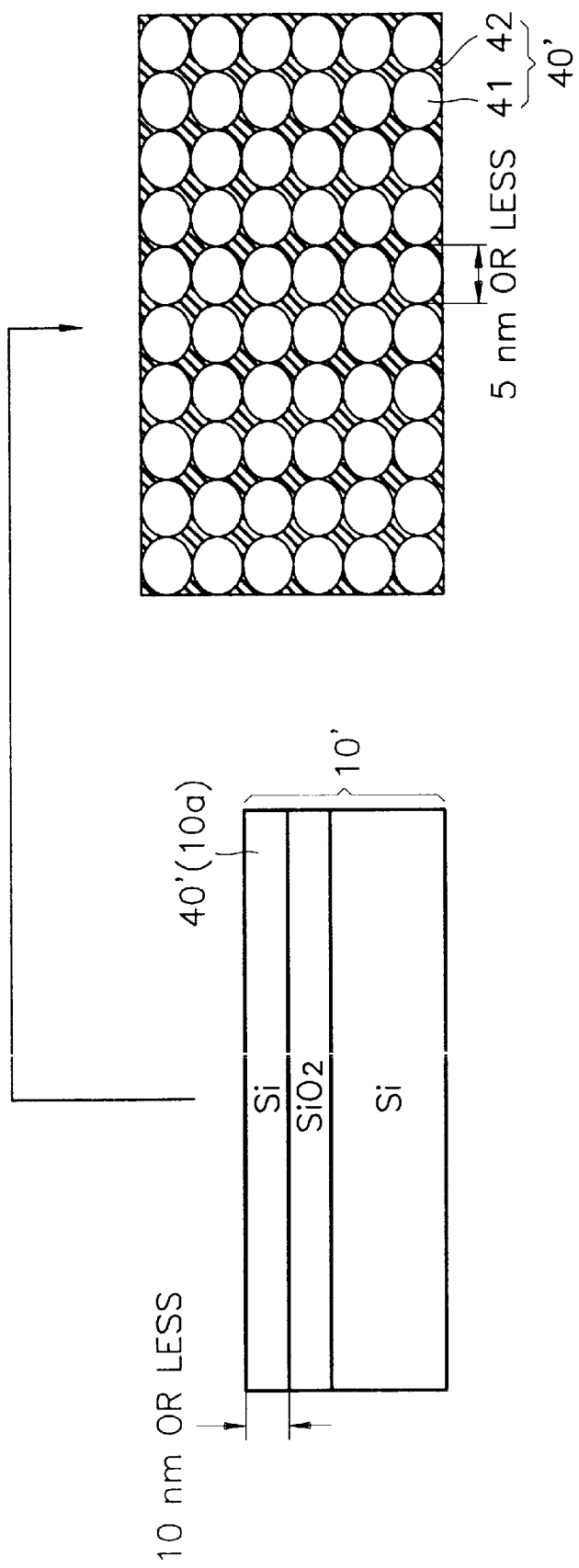
FIGS. 4A through 4C are vertical cross-sectional views of the single electron transistor using porous silicon of FIG. 2 after steps according to another embodiment of the present invention are performed.
Figure 4B:
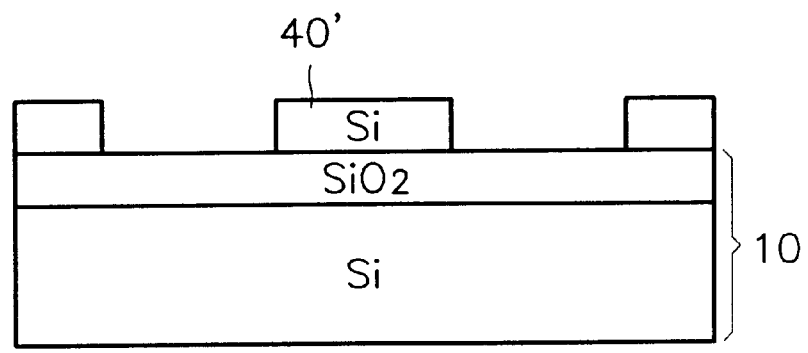

As shown in FIG. 4A first an SOI substrate 10' having a 10-nm silicon layer 40' is selectively etched to expose portions where a source and a drain are to be formed as shown in FIG. 4B.

Figure 4C:
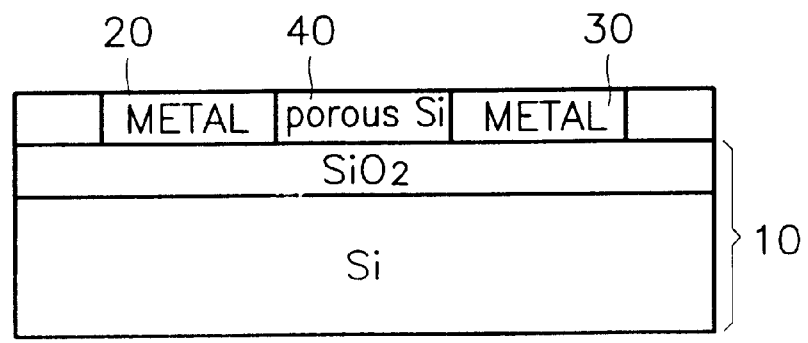

Then, as shown in FIG. 4C, a source 20 and a drain 30 each having a thickness of 100 nm or less are formed by depositing a metal. Here, the metal is deposited by PVD or CVD. Undoubtedly, plating can be used to deposit the metal.

Following this, a porous silicon layer 40 is formed by electrochemically etching the remaining silicon layer 40' to form a channel, using an HF-based solution. Here, the electrochemical etching also includes a simple method of dipping without applying a voltage within a HF-based solution, as well as a method of dipping with a voltage applied within an HF-based solution.

Next, similar to the first method described above, the $SiO_2$ insulative layer 50 having a thickness of 10 nm or less is formed on the porous silicon layer 40 by PVD or CVD, and the gate 60 having a thickness of 100 nm or less is formed on the $SiO_2$ layer 50 by etching or lifting-off, thereby completing the formation of the transistor. Here, the metal deposition is performed by the same method as the deposition method for forming a source and a drain.

Figure 5:
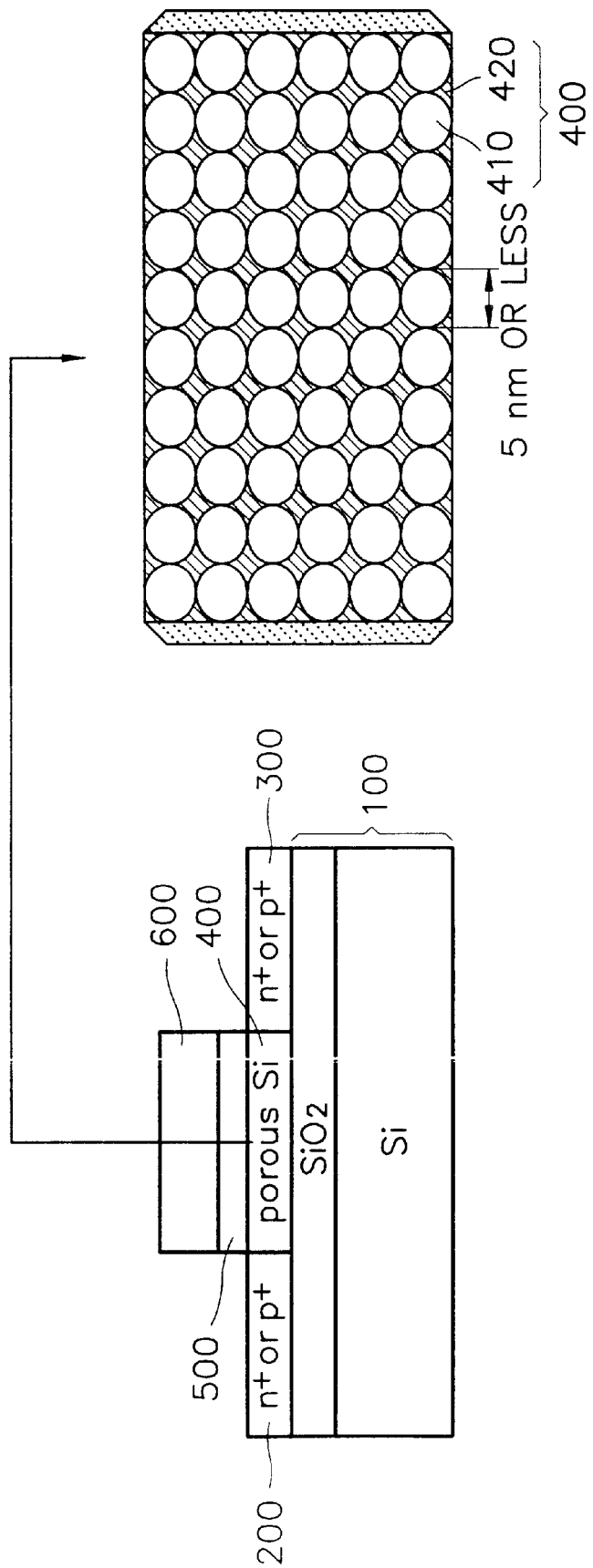
FIG. 5 is a vertical cross-sectional view of a single electron transistor using another type of porous silicon according to the present invention.

FIG. 5 is a vertical cross-sectional view of a single electron transistor using another type of porous silicon according to the present invention. As shown in FIG. 5, in this embodiment, a porous silicon layer 400 having pores 410 each with a diameter of 5 nm or less is formed on an SOI substrate 100 to serve as a channel. A source 200 and a drain 300, which are doped with n+-type impurities or p+-type impurities, are formed on both sides of the porous silicon layer 400. An oxide insulative layer 500 and a gate 600 are sequentially formed on the porous silicon layer 400. Here, silicon 420 between the pores 410 in the porous silicon layer 400, which is a channel, serves as an island, and the porous silicon layer 400 has a thickness of 10 nm or less.

The single electron transistor having such a structure can be fabricated by two methods. The first one is forming a porous silicon layer after a source and a drain are formed by implanting impurities into silicon or doping silicon with impurities.

Figure 6A:
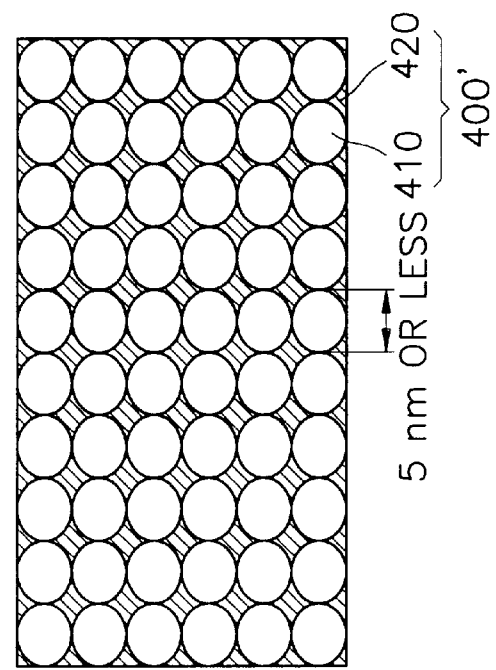
FIGS. 6A through 6C are vertical cross-sectional views of the single electron transistor using porous silicon of FIG. 5 after steps according to an embodiment of the present invention are performed.
Figure 6A:
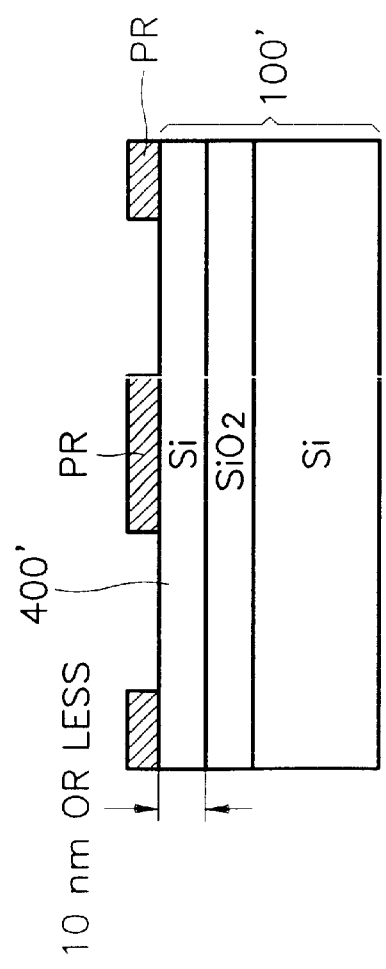
Figure 6B:
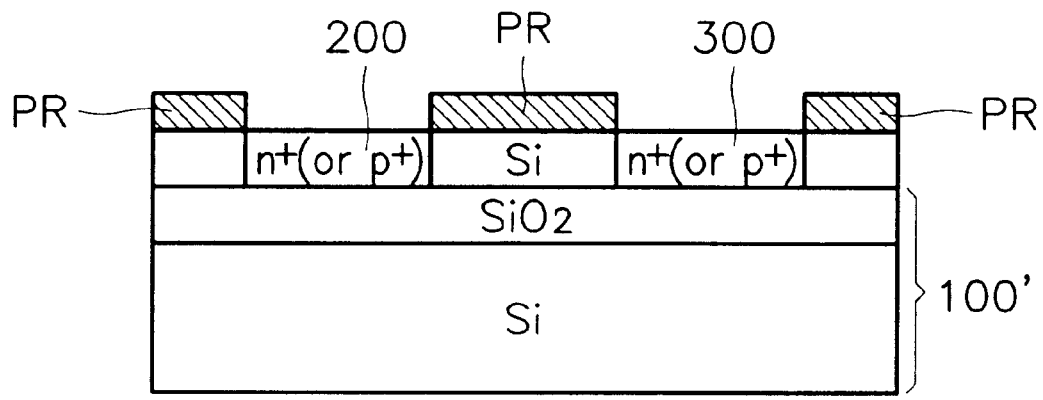

As shown in FIG. 6A, first, a resist pattern is formed on a 10-nm silicon layer 400' in an SOI substrate 100' by lithography. Then, as shown in FIG. 6B, a source 200 and a drain 300 are formed by ion implantation or doping with n+-type (or p+-type) impurities at a concentration of $10^{20}/cm^3$ or less.

Figure 6C:
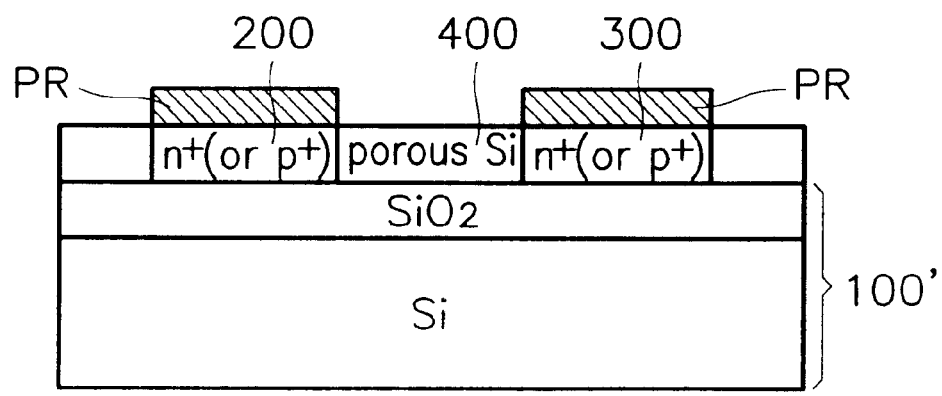

Then, a resist pattern is removed to expose a portion on which a porous silicon layer is to be formed. As shown in FIG. 6C, a resist pattern is formed on the source 200 and the drain 300 to prevent the source 200 and the drain 300 from being exposed to an HF-based solution, and the exposed silicon layer is electrochemically etched, thereby forming a porous silicon layer 400. Here, the diameter of each pore 410 is controlled to be at most 5 nm. The electrochemical etching also includes a simple method of dipping without applying a voltage within a HF-based a method of dipping with a voltage applied within an HF-based solution.

Next, as shown in FIG. 5, the $SiO_2$ insulative layer 500 having a thickness of 10 nm or less is formed on the porous silicon layer 400 by PVD or CVD, and then the gate 600 having a thickness of 100 nm or less is formed on the $SiO_2$ insulative layer 500 by selective etching or lifting-off, thereby completing the formation of the transistor. Here, the gate 600 is formed by depositing metal using PVD or CVD. Undoubtedly, plating can be used to deposit the metal.

In the second method of forming a single electron transistor having the structure shown in FIG. 5, a source and a drain are formed by impurity implantation or doping with impurities after a channel porous silicon layer is formed.

Figure 7A:
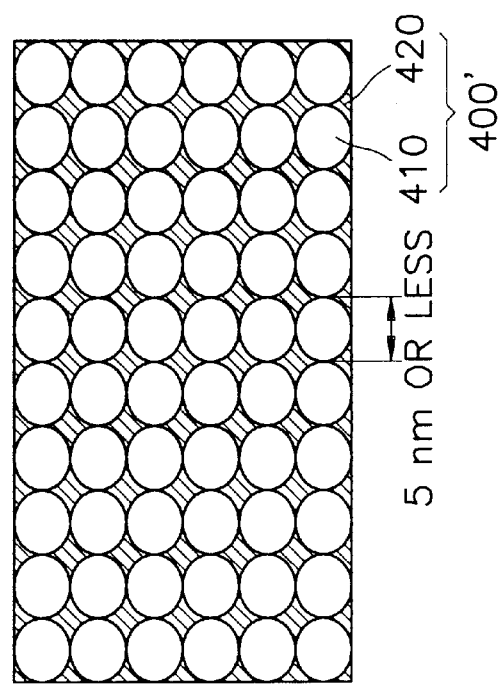
FIGS. 7A through 7C are vertical cross-sectional views of the single electron transistor using porous silicon of FIG. 5 after steps according to another embodiment of the present invention are performed.
Figure 7A:
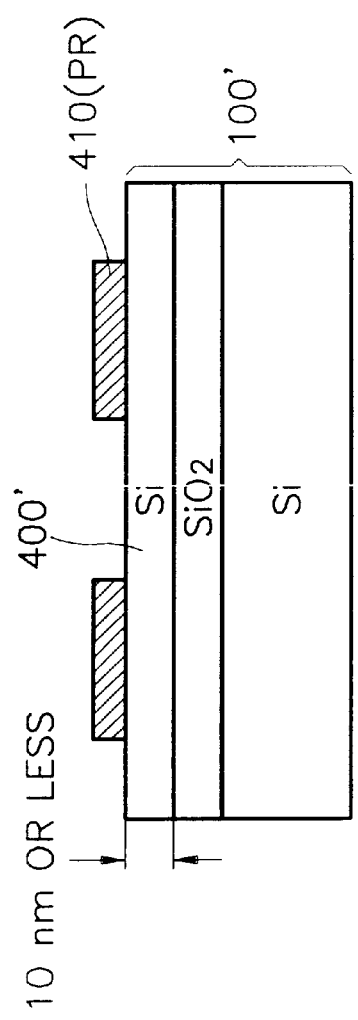
Figure 7B:
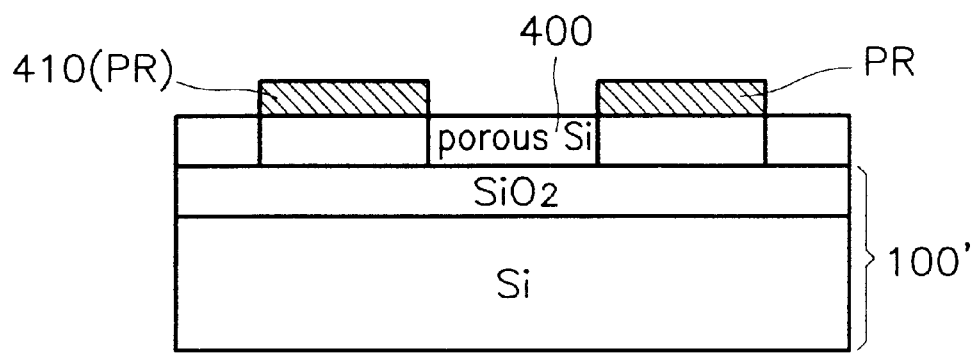

As shown in FIG. 7A, first, resist patterns 410 are formed on a 10-nm silicon layer 400' in an SOI substrate 100' by lithography. Then, a porous silicon layer 400 is formed by electrochemically etching the exposed silicon layer, as shown in FIG. 7B. Here, the diameter of each pore 410 is controlled to be 5 nm or less. The electrochemical etching also includes a simple method of dipping without applying a voltage within a HF-based solution, as well as a method of dipping with a voltage applied within an HF-based solution.

Figure 7C:
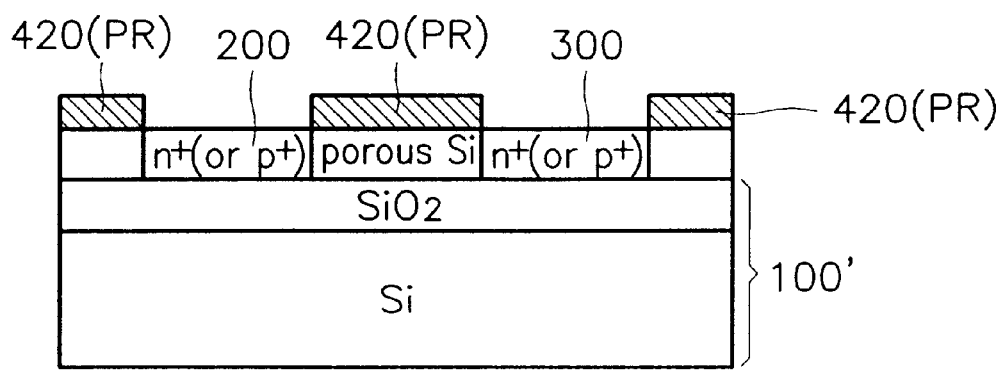

Next, portions on which a source and a drain are to be formed are exposed by removing the resist patterns 410. As shown in FIG. 7C, a resist pattern 420 is formed on the porous silicon layer 400 to prevent the porous silicon layer 400 from being exposed to an HF-based erosion solution then $n^+$-type or $p^+$-type impurities are ion-implanted into the exposed portions on which a source and a drain are to be formed, or the exposed portions are doped with n+-type or p+-type impurities, at a concentration of $10^{20}/cm^3$ or less using a diffusion furnace, thereby forming the source 200 and the drain 300. Then, as shown in FIG. 5, the resist patterns are removed, and the $SiO_2$ insulative layer 500 having a thickness of 10 nm or less is formed on the porous silicon layer 400 by PVD or CVD, and the gate 600 having a thickness of 100 nm or less is formed on the $SiO_2$ insulative layer 500 by a selective etching process or a lifting-off process, thereby completing the formation of the transistor. Here, the gate 600 is obtained by depositing metal using PVD or CVD. Undoubtedly, the metal can be deposited by plating.

In the operation principle of a single electron transistor using porous silicon according to the present invention manufactured by the aforementioned methods, when a voltage is applied to between a source and a drain, current does not flow until the voltage reaches a predetermined value. The predetermined value is referred to as a coulomb blockade gap. The reason why current does not flow is that islands cannot receive electrons anymore since they are charged as an electron is tunneled from the,source to an island. If energies greater than these charging energies are provided via a gate, coulomb blockade does not occur, so that an arbitrary current flows. Thus, if a gate voltage is controlled with the voltage between a source and a drain fixed to the coulomb blockade gap or smaller, switching occurs similar to existing 3-terminal transistors.

As described above, in single electron transistors using porous silicon according to the present invention, silicon pores, each of which has a diameter of 5 nm or less, are fabricated by electrochemically etching a silicon substrate SOI having silicon dioxide ($SiO_2$) in its lower portion using an HF-based solution, and serve as islands of a single electron transistor. Also, a source and a drain are formed of silicon on which metal is deposited or silicon which is doped with impurities. Hence, formation of islands and tunnel barriers is easy, mass production is possible, and the sizes of islands can be controlled by oxidation, so that single electron transistors capable of operating at room temperature can be easily fabricated. In particular, a constriction between silicon pores serves as a tunnel barrier on account of its quantum-mechanical size so that islands having a reproducible and homogeneous size can be produced. That is, in the manufacture of conventional single electron transistors, many complicated and precise manufacturing processes with much effort must be performed to form a tunnel barrier of oxide, and islands having a reproducible and homogeneous size cannot be produced even when these processes are performed. Therefore, in the present invention, silicon pores are used as islands for single electron transistors, so that the two problems can be easily solved. Also, the size of each island can be easily adjusted to nm sizes, a manufacture process is easy, and production is easy due to mass production. Thus, the single electron transistors according to the present invention can be applied to 1 Tetrabit-level memories and logic devices.

What is claimed is:

1. A single electron transistor using porous silicon, comprising:

a substrate;

a porous silicon layer having pores, each of which has a diameter of 5 nm or less, the porous silicon layer formed as a channel on the substrate;

a source and a drain formed of metal on sides of the porous silicon layer opposite to each other;

an insulative layer formed of oxide on the porous silicon layer; and a gate formed on the insulative layer.

2. The single electron transistor using porous silicon of claim 1, wherein the substrate is a silicon on insulator (SOI) substrate.

3. The single electron transistor using porous silicon of claim 1, wherein the porous silicon layer has a thickness of 10 nm or less.

4. A single electron transistor using porous silicon, comprising:

a substrate;

a porous silicon layer having pores, each of which has a diameter of 5 nm or less, the porous silicon layer formed as a channel on the substrate;

a source and a drain formed of silicon doped with impurities on sides of the porous silicon layer opposite to each other;

an insulative layer formed of oxide on the porous silicon layer; and a gate formed on the insulative layer.

5. The single electron transistor using porous silicon of claim 4, wherein the substrate is a silicon on insulator (SOI) substrate.

6. The single electron transistor using porous silicon of claim 4, wherein the porous silicon layer has a thickness of 10 nm or less.

7. The single electron transistor using porous silicon of claim 4, wherein the source and drain are doped with $n^+$-type or $p^+$-type impurities at a concentration of $10^{20}/cm^3$ or less.

* * * * *